(12) United States Patent
Kaide et al.

(10) Patent No.: US 10,961,451 B2
(45) Date of Patent: Mar. 30, 2021

(54) FLUORESCENT MATERIAL AND LIGHT EMITTING DEVICE USING SAME AND METHOD FOR MANUFACTURING FLUORESCENT MATERIAL

(71) Applicant: NICHIA CORPORATION, Anan (JP)

(72) Inventors: Takashi Kaide, Anan (JP); Shoji Hosokawa, Tokushima (JP)

(73) Assignee: NICHIA CORPORATION, Anan (JP)

( * ) Notice: Subject to any disclaimer, the term of this patent is extended or adjusted under 35 U.S.C. 154(b) by 112 days.

(21) Appl. No.: 14/793,056

(22) Filed: Jul. 7, 2015

(65) Prior Publication Data
US 2016/0009991 A1 Jan. 14, 2016

(30) Foreign Application Priority Data

Jul. 8, 2014 (JP) ............................. JP2014-140577
Apr. 16, 2015 (JP) ............................. JP2015-084283

(51) Int. Cl.
*C09K 11/77* (2006.01)
*C09K 11/02* (2006.01)
(Continued)

(52) U.S. Cl.
CPC ...... *C09K 11/7774* (2013.01); *C09K 11/0883* (2013.01); *H01L 33/502* (2013.01);
(Continued)

(58) Field of Classification Search
CPC . C09K 11/7774; C09K 11/7721; C09K 11/02; C09K 11/71; C09K 11/7766; H01L 33/502; Y02B 20/181
(Continued)

(56) References Cited

U.S. PATENT DOCUMENTS

| 5,998,925 A | 12/1999 | Shimizu et al. |
| 2005/0001225 A1 | 1/2005 | Yoshimura et al. |

(Continued)

FOREIGN PATENT DOCUMENTS

| EP | 2141216 A1 | 1/2010 |
| JP | 3503139 B2 | 3/2004 |

(Continued)

OTHER PUBLICATIONS

Machine translation of JP2013170177A, printed May 12, 2017, 28 pages.*

(Continued)

*Primary Examiner* — Matthew E. Hoban
*Assistant Examiner* — Lynne Edmondson
(74) *Attorney, Agent, or Firm* — Hunton Andrews Kurth LLP

(57) ABSTRACT

A fluorescent material is provided that has improved luminance and can generate fluorescence by excitation light in wider wavelength range. A fluorescent material represented by a general formula $La_xCe_ySi_6N_{8+x+y}$, wherein $2.0 \leq x \leq 3.5$, $0 < y \leq 1.0$, wherein the fluorescent material comprises 10 to 10000 ppm of Ba and/or Sr, and wherein a first wavelength and a second wavelength at which excitation intensities are 70% of the maximum of the excitation intensities are present in a wavelength range of 400 to 510 nm, the second wavelength being longer than the first wavelength, and a difference between the first wavelength and the second wavelength being 70 nm or more.

19 Claims, 4 Drawing Sheets

(51) Int. Cl.
*H01L 33/50* (2010.01)
*C09K 11/08* (2006.01)

(52) U.S. Cl.
CPC ........... *H01L 2224/32245* (2013.01); *H01L 2224/48091* (2013.01); *H01L 2224/48257* (2013.01); *H01L 2224/73265* (2013.01); *H01L 2924/181* (2013.01)

(58) Field of Classification Search
USPC .................................................. 252/301.4 F
See application file for complete search history.

(56) References Cited

U.S. PATENT DOCUMENTS

| | | |
|---|---|---|
| 2006/0017041 A1 | 1/2006 | Tian et al. |
| 2007/0007494 A1 | 1/2007 | Hirosaki et al. |
| 2010/0085728 A1* | 4/2010 | Seto ............... C09K 11/0883 362/84 |
| 2013/0168606 A1 | 7/2013 | Hirosaki et al. |
| 2014/0042898 A1 | 2/2014 | Seto et al. |
| 2016/0009991 A1* | 1/2016 | Kaide ............... C09K 11/0883 257/98 |
| 2016/0085728 A1* | 3/2016 | Takada ............... G06F 17/211 715/204 |

FOREIGN PATENT DOCUMENTS

| | | |
|---|---|---|
| JP | 2006-008721 A | 1/2006 |
| JP | 2008-088362 A | 4/2008 |
| JP | 2009-249445 A | 10/2009 |
| JP | 2013-112803 A | 6/2013 |
| JP | 2013-112804 A | 6/2013 |
| JP | 2013170177 A * | 9/2013 |
| JP | 2013-209578 A | 10/2013 |
| WO | 20101114061 A1 | 10/2010 |

OTHER PUBLICATIONS

Daniels, "Color in Minerals", Dec. 2003 from the website https://www.gamineral.org/writings/color-daniels.html, 4 pages.*

Machine translation of JP2013170177A, printed May 12, 2017, 28 pages. (Year: 2013).*

T. Suehiro et al., "Synthesis and Photoluminescent Properties of (La,Ca)3Si6N11:Ce3+ Fine Powder Phosphors for Solid-State Lighting," American Chemical Society Applied Materials & Interfaces, vol. 3, 2011, pp. 811-816, (CN OA Dec. 28, 2016).

European Patent Office, Extended European Search Report in related European patent application No. 15175688.9, dated Nov. 17, 2015, 8 pages.

* cited by examiner

FLUORESCENT MATERIAL AND LIGHT EMITTING DEVICE USING SAME AND METHOD FOR MANUFACTURING FLUORESCENT MATERIAL

CROSS REFERENCE TO RELATED APPLICATION

The present application claims priority under 35 U.S.C. § 119 to Japanese Patent Application No. 2014-140577, filed Jul. 8, 2014 and Japanese Patent Application No. 2015-84283, filed Apr. 16, 2015.

BACKGROUND OF THE INVENTION

1. Field of the Invention

The present disclosure relates to a fluorescent material and a light emitting device using the same and a method for manufacturing the fluorescent material. More specifically, the present disclosure relates to a nitride fluorescent material emitting green to yellow light and a light emitting device using the same and a method for manufacturing the fluorescent material.

2. Description of the Related Art

Light emitting devices have been developed which can emit lights in various color phases based on the principle of light color mixing by combination of a light source with a wavelength conversion member which is excited by a light from the light source, and can emit a light in a different color phase from a color phase of the light source. For example, a primary light in a region of shorter wavelength side corresponding to ultraviolet to visible light is emitted from a light emitting element, and a fluorescent material is excited by this primary light. As a result, wavelength of at least a part of the primary light is converted, and thus, desired light such as red light, blue light, green light or the like can be obtained. Also, white color-based mixed color light can be achieved by additive color mixing of the respective component lights.

By use of this principle, LED lamps which use light-emitting diodes (hereinafter, referred to as "LEDs") as a light source have been used for many fields such as signal lights, mobile phones, various types of illuminations, vehicle indicators, or various types of display apparatuses. In particular, light emitting devices which are constituted by a combination of a LED and a fluorescent material and can emit white color-based light (hereinafter, referred to as "white light emitting devices") are actively applied to backlights of liquid crystal displays, small-sized electronic flashes and the like, and become popular. In addition, recently, the white light emitting devices have been tried to be used for lighting apparatuses. Since the white light emitting devices have advantages of a long life, mercury-free and the like, the white light emitting devices can reduce the environmental load, and thus, expected as light sources which can serve as a substitute for fluorescent lamps.

A constitution of the white light emitting device includes a constitution of combining a LED and a yellow fluorescent material (for example, see JP 3503139 B). Such light emitting device can provide white color-based mixed color light by the color mixing of a light from the LED with a yellow light obtained by a wavelength conversion of a part of the light from the LED by the yellow fluorescent material. As the fluorescent material used for such light emitting device, a fluorescent material is required which is excited efficiently by a light with the wavelength of 420 nm to 470 nm emitted from the LED, and which has a property of emitting a yellow light.

On the other hand, the white light emitting devices are actively studied to improve its light emitting properties. For example, in order to enhance the luminance of the white light, it is important to improve the luminance of color components for the respective colors. For this reason, it is preferable to use a fluorescent material which can convert the primary light from the LED at high energy efficiency. In addition, in order to improve the color rendering property and the color purity of the white light, it is important that the respective component lights emit light with predetermined colors. Therefore, it is desired to use a fluorescent material having its peak in a predetermined wavelength range.

Yttrium-aluminum-garnet-based fluorescent materials activated by cerium are known as such yellow fluorescent material. Also, fluorescent materials in which a part of Y in the yttrium-aluminum-garnet-based fluorescent materials activated by cerium is substituted by Lu, Tb, Gd and the like, as well as fluorescent materials in which a part of Al in the yttrium-aluminum-garnet-based fluorescent materials activated by cerium is substituted by Ga and the like are known. The light emitting wavelength of such yttrium-aluminum-garnet-based fluorescent materials activated by cerium can be adjusted in wider range by the adjustment of those compositions.

On the other hand, nitride fluorescent materials other than oxide fluorescent materials such as the yttrium-aluminum-garnet-based fluorescent materials activated by cerium are also known to have properties which the other inorganic compounds do not have. In recent years, nitride fluorescent materials including elements of three or more component system have been widely studied, and it has been reported that some compounds are excited by LEDs emitting visible to near-ultraviolet light to emit blue to red light.

In addition, in the case where fluorescent materials having different emission spectrum are combined with each other, properties of the white light emitting device can be further enhanced. For example, when $(Sr, Ca)AlSiN_3$:Eu fluorescent material as a nitride-based fluorescent material emitting orange or red light is used in combination with a yellow fluorescent material such as a yttrium-aluminum-garnet-based fluorescent material activated by cerium in a white light emitting device, color rendering property and color reproduction range can be improved (see, for example, JP 2006-008721 A).

Alternatively, in the case where the yttrium-aluminum-garnet-based fluorescent material activated by cerium as a yellow fluorescent material is substituted with the other fluorescent material, color rendering property and color reproduction range can be improved. For example, $La_3Si_6N_{11}$:Ce is reported as such fluorescent material (see, for example, JP 2008-88362 A).

SUMMARY OF THE INVENTION

When $La_3Si_6N_{11}$:Ce-based fluorescent materials are used in light emitting devices such as the white light emitting devices, the light emitting properties of the fluorescent materials are required to be further improved. For example, the fluorescent materials are required to have higher luminance and to be able to generate fluorescence by an excitation light in wider wavelength range. The present disclosure was made in view of such background, and is aimed at providing a fluorescent material which has improved luminance and can generate fluorescence by the excitation light in wider wavelength range.

The present inventors found that fluorescent materials could be improved in those luminance and could generate fluorescence by an excitation light in wider wavelength range by use of $BaF_2$ and/or $SrF_2$ as a flux agent when manufacturing $La_3Si_6N_{11}$:Ce-based fluorescent materials, and thus, the present disclosure has been completed.

A first aspect of the present disclosure provides a fluorescent material represented by a general formula $La_xCe_ySi_6N_{8+x+y}$, wherein $2.0 \leq x \leq 3.5$, $0 < y \leq 1.0$, wherein the fluorescent material comprises 10 to 10000 ppm of Ba and/or Sr, and wherein a first wavelength and a second wavelength at which excitation intensities are 70% of the maximum of the excitation intensities are present in a wavelength range of 400 to 510 nm, the second wavelength being longer than the first wavelength, and a difference between the first wavelength and the second wavelength being 70 nm or more.

A second aspect of the present disclosure provides a fluorescent material represented by a general formula $La_xCe_ySi_6N_{8+x+y}$, wherein $2.0 \leq x \leq 3.5$, $0 < y \leq 1.0$, wherein the fluorescent material comprises 10 to 1000 ppm of Ba and/or Sr, and wherein the minimum of excitation intensities in a wavelength range of 350 to 450 nm is 50% or more of the maximum of the excitation intensities in a wavelength range of 400 to 510 nm.

A third aspect of the present disclosure provides a light emitting device comprising an excitation light source emitting a light in a range from ultraviolet to blue and any one of the fluorescent materials described above.

A forth aspect of the present disclosure provides a method for manufacturing a fluorescent material represented by a general formula $La_xCe_ySi_6N_{8+x+y}$, wherein $2.0 \leq x \leq 3.5$, $0 < y \leq 1.0$, comprising:

weighing elemental substance, oxide, nitride, carbonate, phosphate, silicate or halide of La, Ce and Si to be a stoichiometric ratio of a composition of the fluorescent material, and pulverizing and mixing them with at least $BaF_2$ and/or $SrF_2$ as a flux agent to obtain a raw material mixture;

calcining the raw material mixture under a reducing atmosphere to obtain a calcined body; and pulverizing the calcined body to obtain a fluorescent material in the form of powder.

Since the fluorescent material according to the present disclosure has the above-mentioned features, the fluorescent material has advantages of exhibiting the improved luminance, and being able to generate fluorescence by an excitation light in wider wavelength range. In addition, since the light emitting device according to the present disclosure has the above-mentioned features, the light emitting device can achieve excellent light emitting properties. Furthermore, since the method for manufacturing the fluorescent material according to the present disclosure has the above-mentioned features, the method can provide a fluorescent material which exhibits high luminance and can generate fluorescence by an excitation light in wider wavelength range.

DETAILED DESCRIPTION OF THE EMBODIMENTS

Figure 1:
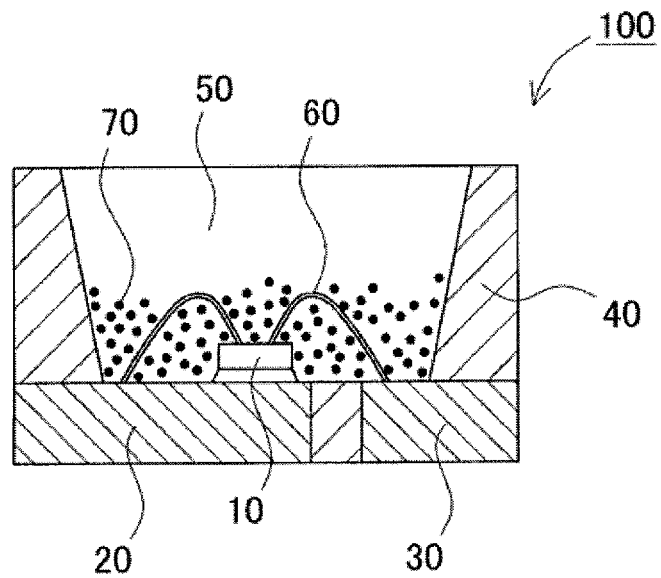
FIG. 1 shows a schematic cross-sectional view of a light emitting device according to an embodiment of the present disclosure.

Hereinafter, an embodiment according to the present disclosure will be described with reference to the drawings. However, the embodiment described below is an example illustrative of a fluorescent material and a method for manufacturing the same and a light emitting device using the fluorescent material for embodying a technical idea of the present disclosure, and the present disclosure is not limited to the fluorescent material and the method for manufacturing the same and the light emitting device using the fluorescent material described below.

In the present specification, a relationship between color names and chromaticity coordinates, a relationship between wavelength ranges of lights and color names of monochromatic lights and the like comply with the provisions of JIS 28110. Specifically, a range from 380 nm to 410 nm corresponds to violet, a range from 410 nm to 455 nm corresponds to bluish violet, a range from 455 nm to 485 nm corresponds to blue, a range from 485 nm to 495 nm corresponds to bluish green, a range from 495 nm to 548 nm corresponds to green, a range from 548 nm to 573 nm corresponds to yellowish green, a range from 573 nm to 584 nm corresponds to yellow, a range from 584 nm to 610 nm corresponds to yellowish red, and a range from 610 nm to 780 nm corresponds to red.

[Fluorescent Material]

A fluorescent material according to the present embodiment is represented by a general formula $La_xCe_ySi_6N_{8+x+y}$, wherein $2.0 \leq x \leq 3.5$, $0 < y \leq 1.0$. The fluorescent material according to the present embodiment comprises 10 to 10000 ppm of Ba and/or Sr. When the fluorescent material comprises both of Ba and Sr, the sum of the contents of Ba and Sr is set to 10 to 10000 ppm. When the content of Ba and/or Sr is 10 ppm or more, light emitting properties of the fluorescent material can be improved. When the content of Ba and/or Sr is 10000 ppm or less, a luminance of the fluorescent material can be increased. The content of Ba and/or Sr is preferably 500 to 10000 ppm. In the case where the content of Ba and/or Sr is within the above-mentioned range, the light emitting properties can be further improved. In addition, the Ba content is more preferably 500 to 2000 ppm, and the Sr content is more preferably 500 to 5000 ppm. In the present specification, the term "ppm" means a weight ratio. At least a part of Ba and/or Sr contained in the fluorescent material is considered to exist in substitution for a part of La sites in the above-mentioned composition formula. In addition, a part of Ba and/or Sr contained in the fluorescent material is also considered to be able to form a compound with F to exist as an impurity phase. The fluorescent material according to the present embodiment has a first wavelength and a second wavelength at which excitation intensities are 70% of the maximum of the excitation intensities in a wavelength range from 400 to 510 nm, and the difference between the first wavelength and the second wavelength is nm or more. In the present specification, "second wavelength" shall be longer than "first wavelength." That is, in the above-mentioned wavelength range of the excitation spectrum, the longest wavelength among the wavelengths at which the excitation intensities are 70% assuming that the maximum excitation intensity is 100% shall be "second wavelength," and the second longest wavelength shall be "first wavelength." With respect to the fluorescent material according to the present embodiment, the wavelength at which the excitation intensities become maximum is about 450 nm. In the case where the difference between the first wavelength and the second wavelength is 70 nm or more, the fluorescent material can generate fluorescence by an excitation light in wider wavelength range, and thus, the fluorescent material can be used in combination with wide variety of excitation light sources. The difference between the first wavelength and the second wavelength is preferably 80 nm or more. In the case where the difference in wavelength is 80 nm or more, the fluorescent material can be used in combination with further wider variety of excitation light sources.

The difference between the first wavelength and the second wavelength is an indicator of a width of a wavelength region of an excitation spectrum (a width of an excitation spectrum) having its intensity peak in the vicinity of 450 nm. The larger difference between the first wavelength and the second wavelength means that the width of the excitation spectrum which has its intensity peak in the vicinity of 450 nm is larger. On the other hand, the emission spectrum of a light emitting element emitting a light in a region from ultraviolet to blue usually has its intensity peak in the vicinity of the wavelength of 450 nm. Therefore, when a light emitting element emitting a light in the region from ultraviolet to blue is used as an excitation light source, with increasing the difference between the first wavelength and the second wavelength, that is, with increasing the width of the excitation spectrum, the fluorescent material can convert a light from a light emitting element in wider wavelength range into an exciting light. In addition, with increasing the ratio of the minimum value of the excitation intensity in the wavelength region from 350 to 450 nm relative to the maximum value of the excitation intensity in the wavelength region from 400 to 510 nm, the fluorescent material can convert a light from a light emitting element in wider wavelength range into an exciting light. In the wavelength region from 350 to 450 nm, the minimum value of the excitation intensity is 50% or more, preferably 60% or more of the maximum value of the excitation intensity in the wavelength region from 400 to 510 nm. When the ratio of the minimum value of the excitation intensity relative to the maximum value of the excitation intensity is within the above-mentioned range, the fluorescent material can be excited more strongly by an excitation light. The fluorescent material having the above-mentioned excitation spectrum is expected to be able to improve the luminous efficiency of the light emitting device with combination of a light emitting element emitting a light in the region from ultraviolet to blue and the fluorescent material according to the present disclosure.

The value of x satisfies preferably $2.0<x<3.3$, and more preferably $2.0<x<3.0$. In the case where the value of x is 2.0 or more, preferably more than 2.0, the fluorescent material having the targeted composition can be obtained efficiently. When manufacturing the fluorescent material, a fluorescent material having different composition from the targeted composition (for example, $LaSi_3N_5$) may be obtained as a by-product in addition to the fluorescent material having the targeted composition. In this case, additional operation is necessary for separating the fluorescent material having the targeted composition and the fluorescent material having the other composition by means of classification and the like. In contrast, in the case where the value of x is set to 2.0 or more, the fluorescent material having the targeted composition can be obtained easily with high efficiency. Thus, an additional operation such as classification is made unnecessary. In addition, the value of x is 3.5 or less, preferably less than 3.3, more preferably less than 3.0. When the value of x is 3.5 or less, it can prevent LaN as a raw material of La and the like from remaining in the fluorescent material. As a result, the fluorescent material can be obtained with high efficiency which has the targeted composition, and thus, exhibits excellent properties. When the value of x is within the above-mentioned range, $La_3Si_6N_{11}$:Ce as the targeted phase can be obtained efficiently. Furthermore, a distribution of elements including Ce as an activator can be uniform, and the properties of the fluorescent material can be improved.

The value of y satisfies preferably $0<y<0.8$, more preferably $0<y<0.5$. Light emission with the targeted wavelength can be obtained by addition of cerium as the activator. In the case where the value of y is 1.0 or less, preferably less than 0.8, more preferably less than 0.5, an interference of cerium elements as the activator with each other can be prevented, and thus, the fluorescent material having high luminance can be obtained.

The fluorescent material according to the present embodiment preferably comprises 10 to 10000 ppm of F. When the content of F is within the above-mentioned range, the fluorescent material exhibiting further higher light emitting properties can be obtained. In addition, the content of F is more preferably 10 to 1000 ppm, and further preferably 50 to 200 ppm.

The fluorescent material according to the present embodiment preferably has at least in part a crystal phase. When the fluorescent material is an amorphous such as glass body, the ratio of the components in the fluorescent material may be un-uniform since the amorphous has un-uniform structure, and thus, the chromaticity is likely to be un-uniform. It is necessary to control strictly the reaction conditions in the production process such that the reaction conditions are uniform, in order to avoid un-uniform chromaticity. In contrast, when at least a part of the fluorescent material has the crystal phase, it is not necessary to control strictly the reaction conditions since the ratio of the components in the fluorescent material can be made uniform easily, and thus, the fluorescent material having uniform color chromaticity can be obtained. In addition, when at least a part of the fluorescent material has the crystal phase, the fluorescent material can be manufactured and processed easily since it can be obtained in the form of powder or grain having the crystal phase instead of a glass phase. Such fluorescent material can be dissolved uniformly in an organic medium, and can easily achieve a preparation of light emitting plastics, polymer thin-film materials and the like. Preferably at least 50% by weight or more, more preferably 80% by weight or more of the fluorescent material according to the present embodiment has the crystal phase. In the present specification, "crystal phase" means a crystal phase having light emitting properties. When 50% by weight or more of the fluorescent material has the crystal phase, better light emitting properties can be obtained. With increasing the proportion of the crystal phase in the fluorescent material, the luminance of the fluorescent material is increased, and thus, the light emitting properties are improved. In addition, with increasing the proportion of the crystal phase in the fluorescent material, the processability of the fluorescent material is enhanced. Therefore, when 80% by weight or more of the fluorescent material has the crystal phase, the fluorescent material having excellent light emitting properties and excellent processability can be obtained.

In light of mounting on the light emitting device, an average particle diameter of the fluorescent material is preferably 15 μm to 40 μm, more preferably 20 μm to 40 μm. When the average particle diameter of the fluorescent material is within the above-mentioned range, conversion efficiency and absorption rate of light can be further increased. In addition, when the average particle diameter of the fluorescent material is 20 μm or more, formation of aggregates can be effectively suppressed. In addition, in the fluorescent material, it is preferable that the frequency distribution of the fluorescent material having the same particle diameter as the above-mentioned average particle diameter is high. Furthermore, with respect to the particle size distribution of the fluorescent material, the distribution having a narrow range is preferable. The light emitting devise with further suppressed color unevenness and good color tone can be obtained by use of the fluorescent material having small variation in the particle diameter and the particle size distribution, as well as the excellent optical characteristics as described above.

In the present specification, the term "average particle diameter" means an average particle diameter measured by the pore electrical resistance method (electrical sensing zone method) based on the Coulter Principle. The pore electrical resistance method is a particle measuring method by use of electrical resistance, and specifically, a method of dispersing the fluorescent material in an electrolyte solution, and evaluating the particle diameter of the fluorescent material based on the electrical resistance arising when the fluorescent material passes through a pore of an aperture tube.

[Method for Manufacturing Fluorescent Material]

Hereinafter, an example of a method for manufacturing the fluorescent material according to the present embodiment will be described. The method for manufacturing the fluorescent material according to the present embodiment comprises: weighing elemental substance, oxide, nitride, carbonate, phosphate, silicate or halide of La, Ce and Si to be a stoichiometric ratio of a composition of a targeted fluorescent material, and pulverizing and mixing them with at least $BaF_2$ and/or $SrF_2$ as a flux agent to obtain a raw material mixture; calcining the raw material mixture under a reducing atmosphere to obtain a calcined body; and pulverizing the calcined body to obtain a fluorescent material in the form of powder.

First, elemental substance, oxide, nitride, carbonate, phosphate, silicate or halide of La, Ce and Si as the raw material are weighed to be a stoichiometric ratio of the composition of the fluorescent material represented by the general formula $La_xCe_ySi_6N_{8+x+y}$, wherein $2.0 \leq x \leq 3.5$, $0 < y \leq 1.0$.

As a raw material of La, nitrides, oxides and the like are preferably used; however, the other compounds or the elemental substance can also be used. When the nitride or the elemental substance of La is used as the raw material, the amount of oxygen element contained in the obtained fluorescent material can be reduced, and the fluorescent material exhibiting further higher properties can be obtained. The raw material of La includes, for example, LaN, $La_2O_3$, LaSi, $LaSi_2$ and the like. As the raw material of La, one type of the raw material may be used alone, or two or more types of the raw materials may be used in combination.

As a raw material of Ce which is the activator, nitrides, oxides and the like is preferably used; however, the other compounds or elemental substance can also be used. When the nitride or the elemental substance of Ce is used as the raw material, the amount of oxygen element contained in the obtained fluorescent material can be reduced, and the fluorescent material exhibiting further higher properties can be obtained. The raw material of Ce as the activator includes, for example, halides, carbonates, phosphates, silicates and the like. In addition, when cerium fluoride as the fluorides is used as the raw material of Ce which is the activator, cerium fluoride serves not only as the raw material of the fluorescent material but also as the flux agent. Therefore, it is preferable to use cerium fluoride as the raw material of Ce. As the raw material of Ce, one type of the raw material may be used alone, or two or more type of the raw materials may be used in combination.

It is preferable to use nitrides or oxides as a raw material of Si. However, imide compounds, amide compounds and the like can also be used. In the case where the nitride or the elemental substance of Si is used as the raw material, the amount of oxygen element contained in the obtained fluorescent material can be reduced, and the fluorescent material exhibiting further higher property can be obtained. The raw material of Si includes, for example, $Si_3N_4$, $SiO_2$, $Si(NH)_2$ and the like. On the other hand, even when only the elemental substance of Si is used, it is possible to synthesize the fluorescent material which is inexpensive and has good crystallinity. The purity of the raw material of Si is preferably 2N or more. However, it may contain other element(s) such as Li, Na, K and B. Furthermore, a part of Si may be substituted by Al, Ga, In, Tl, Ge, Sn, Ti, Zr, Hf and the like. As the raw material of Si, one type of the raw material may be used alone, or two or more types of the raw materials may be used in combination.

In addition to the respective raw materials described above, a flux agent is added which has a function of forming a liquid phase at the calcining temperature described below to accelerate the reaction. By addition of the flux agent, the luminance of the fluorescent material can be improved, and the fluorescence can be generated by an excitation light in wider wavelength range. $BaF_2$ and $SrF_2$ can be used as the flux agent. In the method according to the present embodiment, one type of the flux agent may be used alone, or two types of the flux agents may be used in combination. The content of the flux agent in the raw material mixture is preferably 0.01 to 15.0% by weight. In the case where the content of the flux agent is 0.01% by weight or more, the fluorescent material having furthermore excellent light emitting properties can be obtained. In the case where the content of the flux agent is 15.0% by weight or less, the fluorescent material exhibiting higher luminance can be obtained. Furthermore, halides of alkali metals and/or halides of alkaline-earth metals other than Ba and Sr may also be used as the flux agent in addition to $BaF_2$ and/or $SrF_2$.

Each of the weighed raw materials is pulverized and mixed together with at least $BaF_2$ and/or $SrF_2$ as the flux agent to obtain a raw material mixture. Pulverizing and mixing of each raw material can be carried out in a dry or wet manner by use of a mixer. Pulverizing and mixing can be carried out by combination of a pulverizer such as ball mills which are commonly used in industry as well as vibration mills, roll mills, jet mills, mortars and pestles and the like, with a mixer such as ribbon blenders, V-type blenders, Henschel mixers and the like. The specific surfaces of the raw materials can be increased by pulverization of the raw materials. In addition, in order for the specific surfaces of the raw material powders to be within certain ranges, classification can also be carried out by use of a wet separator such as settling tanks, hydrocyclones and centrifuges and/or a dry classifier such as cyclones and air separators which are commonly used in industry. When the raw materials are unstable in the air, pulverizing and mixing may be carried out within a glove box under an argon or nitrogen atmosphere. By pulverizing and mixing in such manner, the raw material mixture can be obtained.

Subsequently, the raw material mixture is calcined under a reducing atmosphere to obtain a calcined body by procedures described below. First, the above-mentioned raw material mixture is filled in a crucible such as SiC, quartz, alumina or BN crucible, and then calcined under the reducing atmosphere such as $N_2$, $H_2$ and the like. Calcination can also be carried out under argon atmosphere, ammonia atmosphere, carbon monoxide atmosphere, hydrocarbon atmosphere and the like. It is preferable to carry out calcination at a temperature of 1000 to 2000° C. for 1 to 30 hours. The calcining pressure is preferably from atmospheric pressure to 10 atmospheric pressures. Calcination can be carried out in tubular furnace, high-frequency furnace, metal furnace, atmosphere furnace, gas-pressurized furnace or the like. By calcination in such manner, the calcined body can be obtained.

Subsequently, the obtained calcined product is pulverized to obtain the fluorescent material in the form of powder. The fluorescent material in the form of powder obtained by pulverization may be dispersed in water, and then, recovered by a solid-liquid separation to remove impurities. The solid-liquid separation can be performed by a method such as filtration, suction filtration, pressure filtration, centrifugal separation and decantation which are commonly used in industry. The fluorescent material recovered by the solid-liquid separation can be dried by use of an apparatus such as vacuum dryers, hot air heating dryers, conical dryers and rotary evaporators which are commonly used in industry. In addition, by a treatment of the fluorescent material with an acidic solution, a portion other than the targeted crystal phase can be removed, and the content of the impurity phase in the fluorescent material can be reduced. As a result, the luminous efficiency of the fluorescent material can be further improved.

[Light Emitting Device]

An example of a light emitting device mounting the fluorescent material according to the present embodiment will be described below. The light emitting device according to the present embodiment is equipped with an excitation light source emitting a light in a region from ultraviolet to blue, and the fluorescent material according to the present disclosure. In the light emitting device according to the present embodiment, the fluorescent material and the excitation light source have only to be arranged such that the fluorescent material absorbs a part of a light emitted by the excitation light source to emit a light, and such that the light from the excitation light source and the light from the fluorescent material can be extracted from the light emitting device, and the arrangement of the fluorescent material and the excitation light source is not limited to specific embodiment. The light emitting device includes, for example, lighting apparatuses such as fluorescent lamps, display apparatuses such as displays and radars, backlights for liquid crystal displays and the like. In addition, it is preferable to use a light emitting element emitting a light in the short-wavelength region from near-ultraviolet light to visible light, for example, LED as the excitation light source. In particular, a semiconductor light emitting element is preferable since it is small in size, has good power efficiency, and emits a light having vivid color. As the other excitation light source, mercury lamps and the like used for existing fluorescent lamps can be used suitably.

As the light emitting device mounting the light emitting element as the excitation light source, there are various types of light emitting devices such as so-called bullet type light emitting devices and surface-mount type light emitting devices. In the present embodiment, surface-mount type light emitting device is described with reference to FIG. 1.

FIG. 1 is a schematic cross-sectional view of the light emitting device 100 according to the present embodiment. The light emitting device 100 according to the present embodiment comprises a package 40 having a concave portion, a light emitting element 10 as the excitation light source, a sealing member 50 for covering the light emitting element 10.

The light emitting element 10 is arranged on the bottom surface of the concave portion formed on the package 40, and is electrically connected via conductive wires 60 to a pair of positive and negative lead terminals 20 and 30 arranged in the package 40.

The sealing member 50 is filled in the concave portion to cover the light emitting element 10. The sealing member 50 contains a fluorescent material 70. The sealing member 50 protects the light emitting element 10 and the other members from the external environment, and also serves as a wavelength conversion member.

A pair of the positive and the negative lead terminals and 30 is exposed at their ends on the outer side surface of the package 40. The light emitting device 100 is supplied with electric power from the outside through these lead terminals 20 and 30 to emit light. The respective members constituting the light emitting device according to the present embodiment will be described below.

(Light Emitting Element)

The light emitting element 10 can emit a light from ultraviolet light region to visible light region. The peak wavelength of the light emitted by the light emitting element 10 is preferably 240 nm to 520 nm, more preferably 420 nm to 470 nm. As the light emitting element 10, for example, a nitride semiconductor element ($In_XAl_YGa_{1-X-Y}N$, 0≤X, 0≤Y, X+Y≤1) can be used. In the case where the nitride semiconductor element is used as the light emitting element 10, the stable light emitting device having resistance to mechanical impact can be obtained.

(Sealing Member)

In the light emitting device 100, the sealing member 50 is filled to cover the light emitting element 10 mounted within the concave portion formed on the package 40. Transparent resins and glasses can be used as the sealing member 50. In light of ease in manufacturing, the sealing member 50 is preferably a transparent resin. As the transparent resin, silicone resin compositions are preferably used; however, insulating resin compositions such as epoxy resin compositions and acryl resin compositions can also be used. The sealing member 50 contains the fluorescent material 70. The sealing member 50 can further contains an additive member suitably. For example, due to the sealing member 50 containing a light diffusion member, the directivity from the light emitting element 10 can be lessened, and the viewing angle can be increased.

(Fluorescent Material)

The fluorescent material 70 in the present embodiment comprises the above-mentioned fluorescent material according to the present disclosure. The fluorescent material 70 absorbs a part of the light emitted by the excitation light source (light emitting element 10) to emit a light. In the light emitting device 100 shown in FIG. 1, the fluorescent material 70 is formulated such that it is unevenly distributed in part within the sealing member 50. The sealing member 50 serves as not only a member for protecting the light emitting element 10 and the fluorescent material 70 from the external environment but also a wavelength conversion member. By the fluorescent material 70 mounted close to the light emitting element 10 as shown in FIG. 1, the light from the light emitting element 10 can be subject to wavelength conversion efficiently, and the luminous efficiency of the light emitting device 100 can be further improved. The arrangement of the wavelength conversion member comprising the fluorescent material 70 and the light emitting element is not limited to the embodiment of arranging them closely with each other, and it is also possible to arrange the light emitting element 10 and the wavelength conversion member comprising the fluorescent material 70 with keeping a space therebetween in view of the influence of heat generated by the light emitting element 10 on the fluorescent material 70. Also, a light emitting device emitting a light with reduced color irregularity can be obtained by the fluorescent material 70 being present in approximately uniformly dispersed form within the sealing member 50.

In the light emitting device, one type of the fluorescent material may be used alone, or two or more fluorescent materials may be used in combination. For example, in the light emitting device according to the present embodiment, white light having excellent color rendering property can be obtained by combined use of a fluorescent material emitting red light in addition to the combination of a light emitting element emitting blue light with the fluorescent material according to the present disclosure.

As a red fluorescent material emitting red light, nitride fluorescent materials such as $(Ca_{1-x}Sr_x)AlSiN_3:Eu(0 \leq x \leq 1.0)$ or $(Ca_{1-x-y}Sr_xBa_y)_2Si_5N_8:Eu(0 \leq x \leq 1.0, 0 \leq y \leq 1.0, x+y \leq 1.0)$, and halide fluorescent materials such as $K_2(Si_{1-a-b}Ge_aTi_b)F_6:Mn(0 \leq a \leq 1, 0 \leq b \leq 1, a+b \leq 1.0)$ can be used in combination with the fluorescent material according to the present disclosure. In the case where these fluorescent materials emitting red light are used in combination, half-value widths of component lights corresponding to three primary colors can be increased, and thus, white light more rich in warm colors can be obtained.

Also, Mg fluorogermanate fluorescent material activated by $Mn^{4+}$ ($3.5MgO.0.5MgF_2.GeO_2:Mn^{4+}$) or $M^1_2M^2F_6:Mn^{4+}$ ($M^1=Li^+$, $Na^+$, $K^+$, $Rb^+$, $Cs^+$, $NH_4^+$; $M^2=Si$, Ge, Sn, Ti, Zr) can be used as the red fluorescent material. In the case where these red fluorescent materials are used in combination, half-value widths of component lights corresponding to three primary colors can be decreased, and thus, white light more rich in color reproducibility can be obtained when a light emitting device is used as a light source of a backlight unit for a liquid crystal display.

Additionally, as an example of fluorescent materials which can be used further in combination, oxysulphide fluorescent materials activated by Eu such as $(La, Y)_2O_2S:Eu$, sulphide fluorescent materials activated by Eu such as $(Ca, Sr)S:Eu$, halophosphate fluorescent materials activated by Eu, Mn such as $(Sr, Ca, Ba, Mg)_{10}(PO_4)_6Cl_2:Eu$, Mn, oxide fluorescent materials activated by Ce such as $Lu_2CaMg_2(Si, Ge)_3O_{12}:Ce$, oxynitride fluorescent materials activated by Eu such as α-sialon can be used as the fluorescent material emitting red light.

Also, a green fluorescent material and/or a blue fluorescent material can be used further in combination in the light emitting device according to the present embodiment. In the case where the fluorescent material emitting green light and/or the fluorescent material emitting blue light are further added which have emission peak wavelengths different from that of the fluorescent material according to the present disclosure, the color reproducibility and the color rendering property can be further improved. Also, in the case where the fluorescent material which absorbs ultraviolet light and emits blue light is added, and combined with a light emitting element emitting ultraviolet light instead of the light emitting element emitting blue light, the color reproducibility and the color rendering property can be improved.

As the green fluorescent material emitting green light, for example, $CaSc_2O_4:Ce$, silicate fluorescent materials such as $(Ca, Sr, Ba)_2SiO_4:Eu$, $Ca_3Sc_2Si_3O_{12}:Ce$, chlorosilicate fluorescent materials such as $Ca_8MgSi_4O_{16}Cl_{2-\delta}:Eu$, Mn ($0 \leq \delta \leq 1.0$), oxynitride fluorescent materials such as $(Ca, Sr, Ba)_3Si_6O_9N_4:Eu$, $(Ca, Sr, Ba)_3Si_6O_{12}N_2:Eu$, $(Ca, Sr, Ba)Si_2O_2N_2:Eu$, β-sialons such as $Si_{6-z}Al_zO_zN_{8-z}:Eu$ ($0 < z \leq 4.2$), aluminate fluorescent materials activated by Ce such as $(Y, Lu)_3(Al, Ga)_5O_{12}:Ce$, sulphide fluorescent materials activated by Eu such as $SrGa_2S_4:Eu$ can be used.

In addition, as the blue fluorescent material emitting blue light, for example, aluminate fluorescent materials activated by Eu such as $(Sr, Ca, Ba)Al_2O_4:Eu$, $(Sr, Ca, Ba)_4Al_{14}O_{25}:Eu$, $(Ba, Sr, Ca)MgAl_{10}O_{17}:Eu$, $BaMgAl_{14}O_{25}:Eu$, Tb, Sm, aluminate fluorescent materials activated by Eu, Mn such as $(Ba, Sr, Ca)MgAl_{10}O_{17}:Eu$, Mn, thiogallate fluorescent materials activated by Ce such as $SrGa_2S_4:Ce$, $CaGa_2S_4:Ce$, halophosphate fluorescent materials activated by Eu such as $(Sr, Ca, Ba, Mg)_{10}(PO_4)_6Cl_2:Eu$ can be used.

EXAMPLES

Florescent materials of Examples 1 to 4 and Comparative Examples 1 to 3 were synthesized by procedures described below.

Example 1

Lanthanum nitride (LaN), silicon nitride ($Si_3N_4$) and cerium nitride (CeN) were used for the raw materials of La, Si and Ce, respectively. Barium fluoride ($BaF_2$) was used as the flux agent. Each of the raw materials was weighed such that the molar ratio of each element satisfies La:Si:Ce:Ba=3:6:0.15:0.25. Specifically, 5.69 g of LaN, 3.48 g of $Si_3N_4$, 0.29 g of CeN and 0.54 g of $BaF_2$ were weighed.

The weighed raw materials were sufficiently pulverized and mixed in a dry manner to obtain a raw material mixture. The content of the flux agent in the raw material mixture was 5.4% by weight. The obtained raw material mixture was filled in a crucible, and calcined under a reducing atmosphere at 1500° C. for 10 hours to obtain a calcined body. The obtained calcined body was pulverized, treated with an acidic solution, and subsequently, dispersed into water, recovered by a solid-liquid separation and dried to obtain a fluorescent material in the form of powder.

Example 2

The fluorescent material according to Example 2 was synthesized by the same procedures as those in Example 1 except that the respective raw materials were weight such that the molar ratio of the respective elements satisfied La:Si:Ce:Ba=3:6:0.15:0.35. The content of the flux agent in the raw material mixture was 7.4% by weight.

Example 3

The fluorescent material according to Example 3 was synthesized by the same procedures as those in Example 1 except that the respective raw materials were weight such that the molar ratio of the respective elements satisfied La:Si:Ce:Ba=3:6:0.15:0.45. The content of the flux agent in the raw material mixture was 9.4% by weight.

Example 4

The fluorescent material according to Example 4 was synthesized by the same procedures as those in Example 1 except that strontium fluoride ($SrF_2$) was used as the flux agent in place of $BaF_2$, and that the respective raw materials were weight such that the molar ratio of the respective elements satisfied La:Si:Ce:Sr=3:6:0.15:0.225. The content of the flux agent in the raw material mixture was 3.6% by weight.

Comparative Example 1

Lanthanum nitride (LaN), silicon nitride ($Si_3N_4$) and cerium fluoride ($CeF_3$) were used for the raw materials of La, Si and Ce, respectively. The flux agents used in Examples were not used in Comparative Example 1. The respective raw materials were weighed such that the molar ratio of the respective elements satisfied La:Si:Ce=3:6:0.15. Particularly, 5.97 g of LaN, 3.65 g of $Si_3N_4$, 0.38 g of $CeF_3$ were weighed. The fluorescent material according to Comparative Example 1 was synthesized by use of each of the weighed raw materials by the same procedures as those in Example 1.

Comparative Example 2

The fluorescent material according to Comparative Example 2 was synthesized by the same procedures as those in Example 4 except that magnesium fluoride ($MgF_2$) was used as the flux agent in place of $SrF_2$. The content of the flux agent in the raw material mixture was 1.8% by weight.

Comparative Example 3

The fluorescent material according to Comparative Example 3 was synthesized by the same procedures as those in Example 4 except that calcium fluoride ($CaF_2$) was used as the flux agent in place of $SrF_2$. The content of the flux agent in the raw material mixture was 2.3% by weight.

Compositions of the fluorescent materials of Examples 1 to 4 and Comparative Examples 1 to 3 were analyzed by ICP analysis (Inductively Coupled Plasma Emission Spectrometry). The compositions (molar ratios) of each of the fluorescent materials as well as the contents (ppm) of Ba, Sr, Mg, Ca, F and O in each of the fluorescent materials evaluated on the basis of the analysis results are shown in Table 1. A mark "<" in Table 1 means that the Ba content was lower than the value shown. Table 1 shows that the Ba content in the fluorescent material of Comparative Example 1 was less than 10 ppm, whereas the fluorescent materials of Examples 1 to 3 contained 610 to 1800 ppm of Ba. In addition, the fluorescent material of Example 4, in which $SrF_2$ was used as the flux agent, contained 4400 ppm of Sr, the fluorescent material of Comparative Example 2, in which $MgF_2$ was used as the flux agent, contained 49 ppm of Mg, and the fluorescent material of Comparative Example 3, in which $CaF_2$ was used as the flux agent, contained 5900 ppm of Ca.

TABLE 1

| | Composition of Fluorescent Material (molar ratio) | | | | Ba content (ppm) | Sr content (ppm) | Mg content (ppm) | Ca content (ppm) | F content (ppm) | O content (ppm) |
|---|---|---|---|---|---|---|---|---|---|---|
| | La (x) | Si | Ce (y) | N | | | | | | |
| Example 1 | 2.77 | 6.00 | 0.15 | 11.17 | 610 | — | — | — | 60 | 1090 |
| Example 2 | 2.75 | 6.00 | 0.14 | 10.97 | 840 | — | — | — | 150 | 819 |
| Example 3 | 2.81 | 6.00 | 0.14 | 10.98 | 1800 | — | — | — | 630 | 1024 |
| Example 4 | 2.75 | 6.00 | 0.12 | 11.06 | — | 4400 | — | — | 450 | 1584 |
| Comparative Example 1 | 2.80 | 6.00 | 0.13 | 11.25 | <10 | — | — | — | 490 | 1725 |
| Comparative Example 2 | 2.83 | 6.00 | 0.12 | 11.35 | — | — | 49 | — | 1600 | 4651 |
| Comparative Example 3 | 2.75 | 6.00 | 0.14 | 11.32 | — | — | — | 5900 | 290 | 4477 |

The average particle diameters Dm (μm) of the fluorescent materials according to the respective Examples and Comparative Examples were measured by the pore electrical resistance method (electrical sensing zone method) based on the Coulter Principle. Also, chromaticities (x, y), luminances and excitation wavelengths of the fluorescent materials according to the respective Examples and Comparative Examples were measured by the fluorescence spectrophotometer F-4500 (from Hitachi High-Technologies Corporation). The measurement results of the average particle diameters Dm (μm) and the chromaticities (x, y) of the respective fluorescent materials are shown in Table 2.

Figure 2:
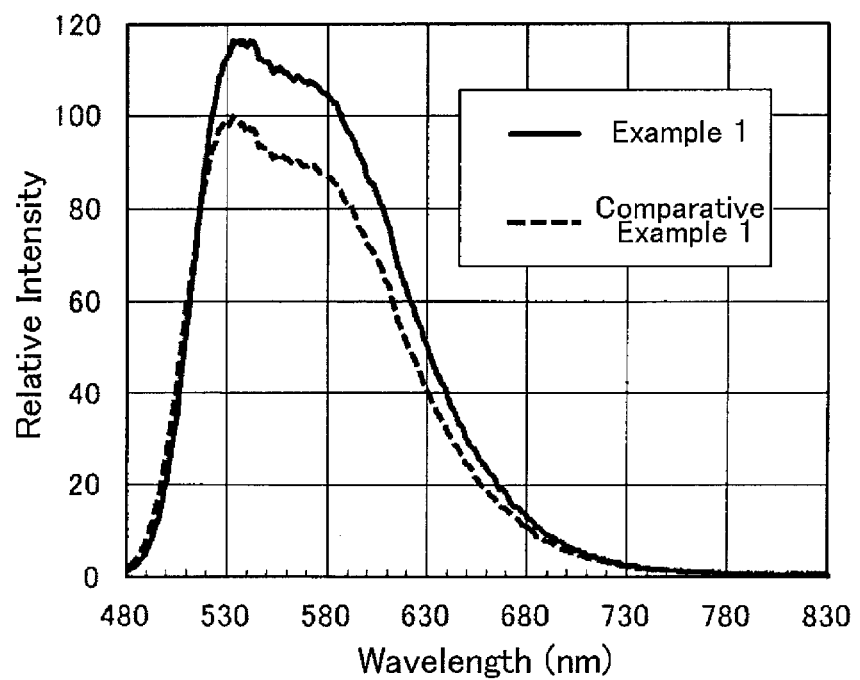
FIG. 2 shows an emission spectrum of fluorescent materials according to Examples and Comparative Examples of the present disclosure.
Figure 3:
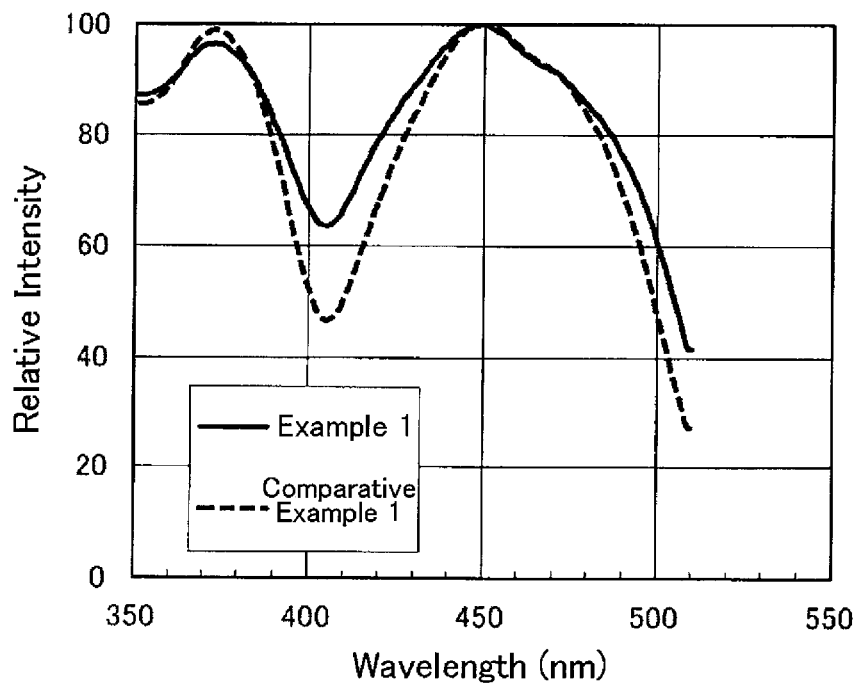
FIG. 3 shows an excitation spectrum of fluorescent materials according to Example and Comparative Example of the present disclosure.

The emission spectrums and the excitation spectrums of the fluorescent materials according to Examples 1 to 4 and Comparative Examples 1 to 3 were measured. The results are shown in FIGS. 2 and 3. In FIGS. 2 and 3, the results of Example 1 and Comparative Example 1 are shown as representatives. The excitation spectrum shown in FIG. 3 was normalized by the intensity at the wavelength of 450 nm so that the difference between the respective fluorescent materials can be easily understood. From the measurement results of the emission spectrum, with respect to the light emission luminance of the fluorescent materials according to the respective Examples and Comparative Examples, luminance ratios were calculated assuming that the luminance of Comparative Example 1 is 100%. In addition, from the measurement results of the excitation spectrum, with respect to the fluorescent materials according to the respective Examples and Comparative Examples, the first wavelengths and the second wavelengths at which the excitation intensities were 70% of the maximum in the wavelength region from 400 to 510 nm were evaluated, and the differences between the first wavelengths and the second wavelengths were calculated. The luminance ratios (%), the first wavelengths (nm), the second wavelengths (nm), and the differences between the first wavelengths and the second wavelengths (nm) of the respective fluorescent materials are shown in Table 2. In Table 2, the term "wavelength difference" means the difference between the first wavelength and the second wavelength. Also, with respect to the fluorescent materials according to the respective Examples and Comparative Examples, the minimum values of the excitation intensities in the wavelength region from 350 to 450 nm in the excitation spectrum were evaluated. The relative intensities of the above-mentioned minimum values of the excitation intensities, assuming that the maximum values of the excitation intensities at the wavelength of 450 nm are 100% are shown in Table 2.

Figure 4:
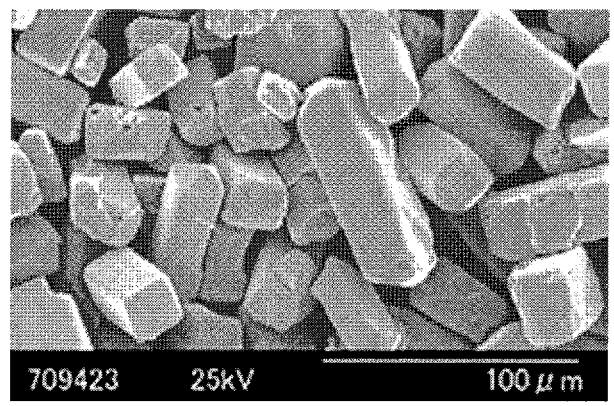
FIG. 4 shows a SEM image of a fluorescent material according to Example 1.
Figure 5:
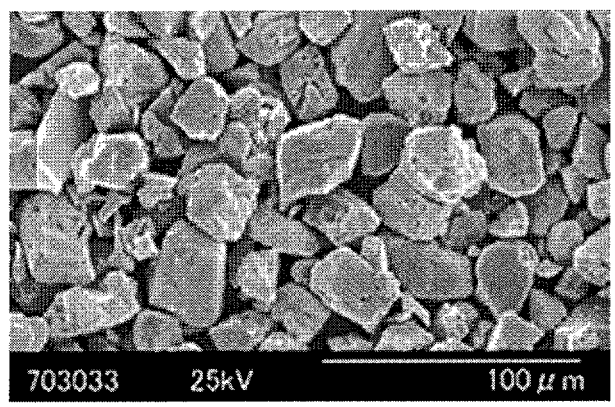
FIG. 5 shows a SEM image of a fluorescent material according to Comparative Example 1.

FIG. 4, and a SEM image of the fluorescent material of Comparative Example 1 is shown in FIG. 5. FIGS. 4 and 5 show that the fluorescent material of Example 1, in which $BaF_2$ was used as the flux agent, had the particle diameter larger than that of the fluorescent material of Comparative Example 1, in which no flux agent was used. Similarly, it was confirmed by SEM measurement that the particle diameters of the fluorescent materials according to Examples 2 and 3 were larger than the particle diameter of the fluorescent material according to Comparative Example 1.

(Emission Spectrum)

FIG. 2 shows that the emission spectrum of the fluorescent material according to Example 1 had a peak at longer wavelength side than a peak in the emission spectrum of the fluorescent material according to Comparative Example 1. Similarly, the emission spectra of the fluorescent materials according to Examples 2 to 4 had peaks at longer wavelength side than the peak in the emission spectrum of the fluorescent material according to Comparative Example 1. Furthermore, it is considered that the luminance of the fluorescent materials according to Examples 1 to 4 could be increased since the shift of the emission spectrum peaks of the fluorescent materials according to Examples 1 to 4 toward the longer wavelength side was a shift in a direction toward higher luminous sensitivity. In addition, the measurement results of chromaticity show that the fluorescent materials according to Comparative Examples 1 to 3 caused a difference in color phase compared to the fluorescent materials according to Examples 1 to 4.

(Luminance)

Table 2 shows that the luminance of the fluorescent materials according to Examples 1 to 4 was about 11 to 20%

TABLE 2

| | Average Particle Diameter Dm (μm) | Chromaticity x | Chromaticity y | luminance ratio (%) | First Wavelength (nm) | Second Wavelength (nm) | Wavelength Difference (nm) | Excitation Intensity Minimum Value (Relative Intensity) |
|---|---|---|---|---|---|---|---|---|
| Example 1 | 25.7 | 0.427 | 0.553 | 116.9 | 412 | 495 | 83 | 63.6 |
| Example 2 | 27.7 | 0.429 | 0.552 | 120.1 | 410 | 496 | 86 | 66.3 |
| Example 3 | 37.2 | 0.429 | 0.552 | 116.9 | 410 | 496 | 86 | 66.3 |
| Example 4 | 19.6 | 0.421 | 0.556 | 110.7 | 417 | 490 | 73 | 54.4 |
| Comparative Example 1 | 20.8 | 0.418 | 0.557 | 100.0 | 421 | 490 | 69 | 46.7 |
| Comparative Example 2 | 12.2 | 0.414 | 0.561 | 100.5 | 423 | 487 | 64 | 41.9 |
| Comparative Example 3 | 14.7 | 0.433 | 0.546 | 95.0 | 420 | 488 | 68 | 44.7 |

(Particle Diameter)

Table 2 shows that the fluorescent materials of Examples 1 to 3, in which $BaF_2$ was used as the flux agent, had the average particle diameter larger than that of the fluorescent material of Comparative Example 1, in which no flux agent was used. The fluorescent material of Example 4, in which $SrF_2$ was used as the flux agent, had the average particle diameter equivalent to that of the fluorescent material of Comparative Example 1. The fluorescent materials of Comparative Examples 2 and 3, in which $MgF_2$ or $CaF_2$ was used as the flux agent, had the average particle diameter smaller than that of the fluorescent material of Comparative Example 1.

(SEM Measurement)

A SEM (Scanning Electron Microscope) image of the fluorescent material according to Example 1 is shown in higher compared to the luminance of the fluorescent material according to Comparative Example 1, in which no flux agent was used. In addition, the luminance of the fluorescent materials according to Comparative Examples 2 and 3, in which $MgF_2$ or $CaF_2$ was used as the flux agent, were found to be equivalent to the luminance of the fluorescent material according to Comparative Example 1 or less.

(Excitation Spectrum)

Table 2 shows that the differences between the first wavelengths and the second wavelengths in the fluorescent materials according to Examples 1 to 4, in which $BaF_2$ or $SrF_2$ was used as the flux agent, were larger compared to that of the fluorescent material according to Comparative Example 1, in which these flux agents were not used. There are at least two possible reasons for the above-mentioned matter: the width of the excitation spectrum of the fluorescent material was increased by substitution of a part of the elements of $BaF_2$ or $SrF_2$ used as the flux agent for La; and the crystallinity of the fluorescent material was improved by use of $BaF_2$ or $SrF_2$ as the flux agent, and as a result, the width of the excitation spectrum of the fluorescent material was increased. On the other hand, it is shown that the differences between the first wavelengths and the second wavelengths in the fluorescent materials according to Comparative Examples 2 and 3, in which $MgF_2$ or $CaF_2$ was used as the flux agent, were smaller compared to that of the fluorescent material according to Comparative Example 1. The possible reason for the above-mentioned matter is that $CeF_2$ used as the raw material for the fluorescent material according to Comparative Example 1 also served as the flux agent, and that the crystallinities of the fluorescent materials according to Comparative Examples 2 and 3 using $MgF_2$ or $CaF_2$ as the flux agent were not improved compared to that of the fluorescent material according to Comparative Example 1. As a result, it was shown that the fluorescent materials according to Examples 1 to 4 could be excited by an excitation light in wider wavelength range compared to the fluorescent materials according to Comparative Examples 1 to 3. In addition, Table 2 shows that the minimum values of the excitation intensities for the fluorescent materials according to Examples 1 to 4 were 50% or more, assuming that the maximum values of the excitation intensities were 100%. Furthermore, it is shown that the minimum values of the excitation intensities for Examples 1 to 3 using $BaF_2$ as the flux agent were 60% or more, assuming that the maximum values of the excitation intensities were 100%. This showed that the fluorescent materials according to Examples 1 to 4 could be excited by the excitation light more strongly compared to the fluorescent materials according to Comparative Examples 1 to 3.

From the above-mentioned results, it was shown that the fluorescent materials according to Examples 1 to 4 had higher luminance, and could be excited by a light in wider wavelength range compared to the fluorescent materials according to Comparative Examples 1 to 3, and had excellent light emitting properties.

Figure 6:
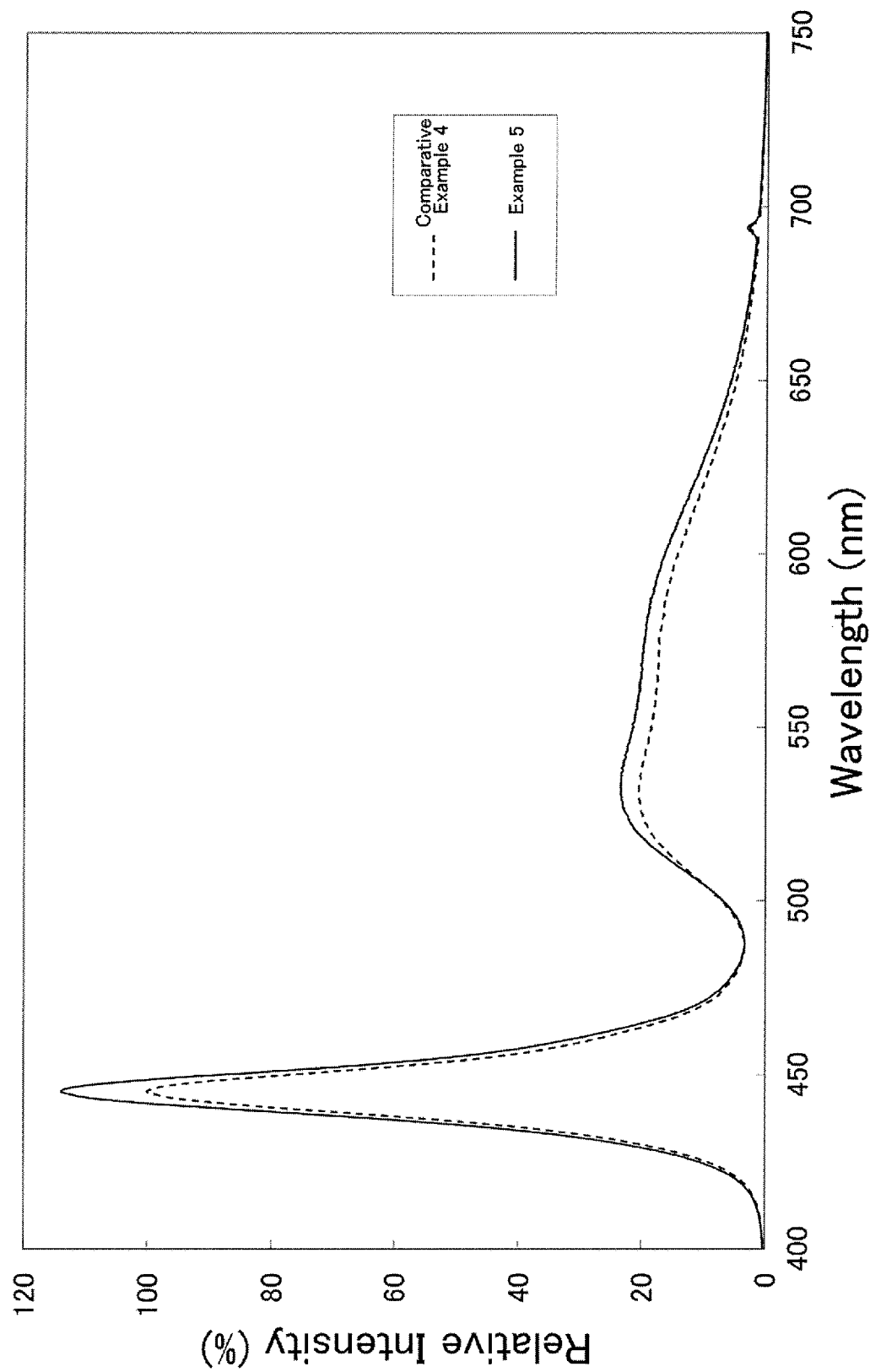
FIG. 6 shows an emission spectrum of light emitting devices according to Example and Comparative Example of the present disclosure.

Furthermore, light emitting devices of Comparative Example 4 and Examples 5 to 7 were prepared by use of the above-mentioned fluorescent materials according to Comparative Example 1 and Examples 1 to 3, respectively. The light emitting devices of Comparative Example 4 and Examples 5 to 7 were surface-mount type light emitting devices as shown in FIG. 1. In the respective Examples and Comparative Example, a nitride semiconductor light emitting element having an outside dimension of 500 μm×290 μm and emitting light with a peak wavelength of 450 nm was used as the excitation light source, and a silicone resin was used as the sealing member. The above-mentioned light emitting element was disposed on a concave portion formed on a package of the light emitting device, and the silicone resin containing any of the fluorescent materials of Comparative Example 1 and Examples 1 to 3 was filled into the concave portion so as to cover the light emitting element to prepare the light emitting devices of Comparative Example 4 and Examples 5 to 7. The respective light emitting devices of Comparative Example 4 and Examples 5 to 7 obtained in this manner were driven under a condition of forward current of 150 mA and forward voltage of 3.3 V to measure luminous fluxes. The luminous fluxes of the light emitting devices were measured by use of integral total luminous flux measuring apparatus. Based on the measurement results of the luminous fluxes, luminous flux ratios of the light emitting devices according to the respective Examples and Comparative Example were calculated assuming that the luminous flux of Comparative Example 4 was 100. The results are shown in Table 3 and FIG. 6. FIG. 6 shows the emission spectrum of the light emitting devices according to Comparative Example 4 and Example 5 as representatives. As shown in Table 3, the light emitting devices of Examples 5 to 7 in which the fluorescent materials according to Examples 1 to 3 were respectively used were confirmed to exhibit higher values of luminous fluxes compared to the light emitting device of Comparative Example 4, in which the fluorescent material according to Comparative Example 1 was used. In addition, as shown in FIG. 6, the light emitting device of Example 5 was confirmed to have larger light emitting intensity than that of the light emitting device of Comparative Example 4 in a wavelength region including green. Similarly, the light emitting devices of Examples 6 and 7 were confirmed to have larger light emitting intensity than that of the light emitting device of Comparative Example 4.

TABLE 3

| | Fluorescent Material | Luminous Flux Ratio | Chromaticity x | y |
|---|---|---|---|---|
| Comparative Example 4 | Comparative Example 1 | 100.0 | 0.259 | 0.233 |
| Example 5 | Example 1 | 114.0 | 0.260 | 0.233 |
| Example 6 | Example 2 | 114.4 | 0.260 | 0.232 |
| Example 7 | Example 3 | 113.3 | 0.262 | 0.235 |

INDUSTRIAL APPLICABILITY

The fluorescent material according to the present disclosure can be used favorably for a white lighting sources, LED displays, back light sources, signal lights, illuminated switches, various sensors, various indicators and the like which comprise particularly a blue or ultraviolet light emitting diode as a light source and have quite excellent light emitting properties.

REFERENCE SIGNS LIST

100 Light emitting device
10 Light emitting element
20, 30 Lead terminal
40 Package
50 Sealing member
60 Conductive wire
70 Fluorescent material

What is claimed is:
1. A fluorescent material represented by a general formula $La_xCe_ySi_6N_z$, wherein $2.75 \leq x \leq 2.81$, $0.14 \leq y \leq 0.15$, and $10.97 \leq z \leq 11.17$, wherein
the fluorescent material comprises 610 to 1800 ppm of Ba, 819 to 1090 ppm of O, and 60 to 630 ppm of F; and
a first wavelength and a second wavelength at which excitation intensities are 70% of the maximum of the excitation intensities are present in a wavelength range of 400 to 510 nm, the second wavelength is longer than the first wavelength, and a difference in wavelength between the first wavelength and the second wavelength is 70 nm or more.
2. The fluorescent material according to claim 1, wherein the minimum of the excitation intensities in a wavelength range of 350 to 450 nm is 50% or more of the maximum of the excitation intensities in the wavelength range of 400 to 510 nm.

3. A fluorescent material represented by a general formula $La_xCe_ySi_6N_z$, wherein $2.75 \leq x \leq 2.81$, $0.14 \leq y \leq 0.15$, and $10.97 \leq z \leq 11.17$, wherein the fluorescent material comprises 610 to 1800 of Ba, 819 to 1090 ppm of O, and 60 to 630 ppm of F; and the minimum of excitation intensities in a wavelength range of 350 to 450 nm is 50% or more of the maximum of the excitation intensities in a wavelength range of 400 to 510 nm.

4. The fluorescent material according to claim 1, further comprising 60 to 450 ppm of F.

5. The fluorescent material according to claim 1, wherein the fluorescent material has an average particle diameter of 15 to 40 μm.

6. A light emitting device comprising an excitation light source emitting a light in a range from ultraviolet to blue, and the fluorescent material according to claim 1.

7. A method for manufacturing a fluorescent material, comprising:

weighing elemental substance, oxide, nitride, carbonate, phosphate, silicate or halide of La, Ce and Si to be a stoichiometric ratio of a composition of the fluorescent material represented by a general formula $La_xCe_ySi_6N_z$, wherein $2.75 \leq x \leq 2.81$, $0.14 \leq y \leq 0.15$, and $10.97 \leq z \leq 11.17$, and pulverizing and mixing them with at least $BaF_2$ and/or $SrF_2$ as a flux agent to obtain a raw material mixture;

calcining the raw material mixture under a reducing atmosphere to obtain a calcined body; and pulverizing the calcined body to obtain a fluorescent material in the form of powder, wherein the fluorescent material comprises 610 to 1800 ppm of Ba, 819 to 1090 ppm of O, and 60 to 630 ppm of F.

8. The method according to claim 7, wherein a content of the flux agent in the raw material mixture is from 0.01 to 15.0% by weight.

9. The fluorescent material according to claim 3, further comprising 60 to 450 ppm of F.

10. The fluorescent material according to claim 3, wherein the fluorescent material has an average particle diameter of 15 to 40 μm.

11. A light emitting device comprising an excitation light source emitting a light in a range from ultraviolet to blue, and the fluorescent material according to claim 3.

12. The fluorescent material according to claim 1, wherein the fluorescent material is substantially free of Ca, Mg, and Sr, and wherein the fluorescent material comprises Ba as the only alkaline earth metal.

13. The fluorescent material according to claim 3, wherein the fluorescent material is substantially free of Ca, Mg, and Sr, and wherein the fluorescent material comprises Ba as the only alkaline earth metal.

14. The method according to claim 7, wherein the fluorescent material is substantially free of Ca, Mg, and Sr, and wherein the fluorescent material comprises Ba as the only alkaline earth metal.

15. The fluorescent material according to claim 1, wherein:

an intensity peak is present at approximately the wavelength of 450 nm, the difference in wavelength between the first wavelength and the second wavelength is 80 nm or more, and the fluorescent material comprises a crystal phase of at least 80% by weight.

16. The fluorescent material according to claim 15, wherein a decrease in emission intensity of the intensity peak to the emission intensity at 580 nm is 20% or less.

17. The fluorescent material according to claim 3, wherein:

an intensity peak is present at approximately the wavelength of 450 nm, and the fluorescent material comprises a crystal phase of at least 80% by weight.

18. The fluorescent material according to claim 7, further comprising treating the fluorescent material with an acidic solution to remove a non-crystal phase portion of the material, wherein the fluorescent material comprises a crystal phase of at least 80% by weight.

19. The fluorescent material according to claim 1, wherein $0.427 \leq x \leq 0.429$ and $0.552 \leq y \leq 0.553$.

* * * * *